United States Patent
Tsai et al.

(10) Patent No.: US 6,455,432 B1
(45) Date of Patent: Sep. 24, 2002

(54) METHOD FOR REMOVING CARBON-RICH PARTICLES ADHERED ON A COPPER SURFACE

(75) Inventors: Teng-Chun Tsai, Hsin-Chu; Chia-Lin Hsu, Taipei; Yung-Tsung Wei, Pai-Ho Chen; Ming-Sheng Yang, Hsin-Chu, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/729,220

(22) Filed: Dec. 5, 2000

(51) Int. Cl.[7] .......................................... H01L 21/461
(52) U.S. Cl. ..................... 438/692; 438/691; 438/906
(58) Field of Search .................................. 438/687, 745, 438/906, 692, 600, 690, 691, 693

(56) References Cited

U.S. PATENT DOCUMENTS

| | | | | |
|---|---|---|---|---|
| 6,140,239 A | * | 10/2000 | Avanzino et al. | 438/692 |
| 6,147,002 A | * | 11/2000 | Kneer | 438/692 |
| 6,162,301 A | * | 12/2000 | Zhang et al. | 134/3 |
| 6,177,364 B1 | * | 1/2001 | Huang | 438/792 |
| 6,200,899 B1 | * | 3/2001 | Fournier | 438/693 |
| 6,218,290 B1 | * | 4/2001 | Schonauer et al. | 438/633 |
| 6,245,662 B1 | * | 6/2001 | Naik et al. | 438/622 |
| 6,251,770 B1 | * | 6/2001 | Uglow et al. | 438/624 |

* cited by examiner

Primary Examiner—Caridad Everhart

(57) ABSTRACT

A method for removing carbon-rich particles adhered on a copper surface, especially on a copper surface of a copper/low k dielectric dual damascene structure is provided. A barrier layer and a barrier-CMP stopping layer are formed between the copper layer and the low k dielectric layer of the dual damascene structure. After a Cu-CMP process and a barrier CMP process, a chemical buffing polishing process using an acidic aqueous solution under a downward force of about 0.5 to 3 psi is performed to remove carbon-rich particles adhered on the exposed copper surface, which is due to the low k dielectric layer having at least 90% carbon element being exposed and then polished during the Cu-CMP process and the barrier CMP process, resulting from a dishing phenomenon of the copper layer occurring during the two CMP processes. Alternately, a first chemical buffing polishing process is followed after the Cu-CMP process, and a second chemical buffing polishing process is followed after the barrier CMP process.

35 Claims, 2 Drawing Sheets

METHOD FOR REMOVING CARBON-RICH PARTICLES ADHERED ON A COPPER SURFACE

BACKGROUND OF THE INVENTION

1. Field of the Invention

The present invention relates to a semiconductor process. More particularly, the present invention relates to a method for removing carbon-rich particles adhered on a metal surface, especially on the exposed copper surface of a copper/low k dielectric dual damascene structure.

2. Description of the Prior Art

When the semiconductor process steps into the stage of deep-submicron, it is a trend to employ a Cu damascene process combined with a low k material as an interlayer dielectric to effectively reduce RC delay and improve electromigration property. FIG. 1A shows a typical copper/low k dielectric dual damascene structure. A semiconductor substrate 100 having a substructure comprising devices formed in the substrate and a metal layer formed thereon (not shown in the figure) is provided. And, a barrier-CMP stopping layer 104 formed of silicon nitride ($Si_3N_4$)/or silicon carbide and a barrier layer 106 of Ta/or TaN are inter-layers between a low k dielectric layer 102 formed on the substrate 100 and a copper layer 108. The barrier layer 106 is served for preventing copper diffusion to the low k dielectric layer 102.

Referring to FIG. 1B, during the copper/low k dielectric dual damascene process, a copper chemical mechanical polishing process is firstly applied to planarize the copper layer 108 inlaid into the trench 112 and via hole 110 structures of the low k dielectric layer 102, until the barrier layer 106. Then, a barrier chemical mechanical polishing process is followed to remove the barrier layer 106 until the stopping layer 104. However, the softer copper metal typically polishes back at a faster rate than the surrounding material and then causing dishing in the copper layer 108, as shown in FIG. 1B, the CMP copper layer 108 is provided with a dished structure below the dotted line of the top surface thereof. The low k dielectric layer 102 is easily exposed and then polished during the two CMP processes, due to the dishing phenomenon of the copper layer 108, even though the barrier-CMP stopping layer 104 is applied on the low k dielectric layer 102. The low k dielectric generally carbon-rich, containing at least 90% carbon element, and copper metal and carbon element have reverse electricity in a neutral/or acidic slurry employed in the copper CMP and barrier CMP processes. Therefore, there are many carbon-rich particles produced and adhered on the exposed copper surface of the copper layer 108 inlaid into the trench 112 and the via hole 110, during the two CMP processes, which results in a process defect.

Accordingly, it is desirable to provide a method for effectively remove carbon-rich particles adhered on a copper surface, especially on the exposed copper surface of a copper/low k dielectric dual damascene structure, and then alleviate the drawback of the conventional CMP process for copper/low k dielectric damascene process.

SUMMARY OF THE INVENTION

It is one object of the present invention to provide a method for removing carbon-rich particles adhered on a copper surface, especially on the exposed copper surface of a copper/low k dielectric dual damascene structure. After a Cu-CMP process and barrier CMP process are completed, a chemical buffing polishing process under a downward force of about 0.5 to 3 psi, using an acidic aqueous solution, is applied on the exposed copper surface to effectively remove carbon-rich particles adhered thereon, which is due to the low k dielectric layer containing at least 90% carbon element being exposed and then polished during the two CMP processes, coming from a dishing phenomenon of the copper layer.

It is another object of the present invention to provide a method for removing carbon-rich particles adhered on a copper surface, especially on the exposed copper surface of a copper/low k dielectric dual damascene structure. After a Cu-CMP process, a first chemical buffing polishing process using an acidic aqueous solution is followed, and a second chemical buffing polishing process using an acidic aqueous solution is applied after a barrier CMP process. Both of the two chemical buffing processes are used to remove carbon-rich particles adhered on the exposed copper surface during the two CMP processes.

It is a further object of the present invention to provide a method for removing carbon-rich particles adhered on a copper surface, which is suitably applied to a low k material chemical mechanical polishing process.

In order to achieve the above objects, the present invention provides a method for removing carbon-rich particles adhered on a copper surface, especially on the exposed copper surface of a copper/low k dielectric dual damascene structure. Firstly, providing a semiconductor substrate having a substructure comprising devices formed in the substrate and a metal layer formed thereon. Then, forming a low k dielectric layer over the substrate. Subsequently, forming a stopping layer on the low k dielectric layer. Thereafter, patterning the stopping layer and the low k dielectric layer to form a plurality of via holes for interconnects, and then patterning the stopping layer and the low k dielectric layer to form a plurality of trenches for conductive lines. Afterward, forming a conformal blanket layer above the patterned layer of the stopping layer and the low k dielectric layer as a barrier layer. Following, forming a copper layer over the barrier layer to fill the via hole and the trench. Then, performing a copper chemical mechanical polishing process to planarize the copper layer until the barrier layer. Subsequently, performing a barrier chemical mechanical polishing process to remove the barrier layer until the stopping layer. Following, performing a chemical buffing polishing process under a downward force of about 0.5 to 3 psi using an acidic aqueous solution to remove the carbon-rich particles adhered on the exposed copper surface of the copper layer filled in the trench and the via hole. Finally, performing a post chemical mechanical polishing cleaning process to remove away dirt left on the exposed copper surface. Alternately, a first chemical buffing polishing process is applied after the Cu-CMP process, and a second chemical buffing polishing process is performed after the barrier CMP process.

BRIEF DESCRIPTION OF THE DRAWINGS

The present invention can be best understood through the following description and accompanying drawings wherein.

DESCRIPTION OF THE PREFERRED EMBODIMENTS

The present method is suitable for removing carbon-rich particles adhered on a metal surface. However, in embodiments of the present invention, a copper/low k dielectric dual damascene structure, as shown in FIG. 1B, is used as an example for employing the present method.

Figure 1A:
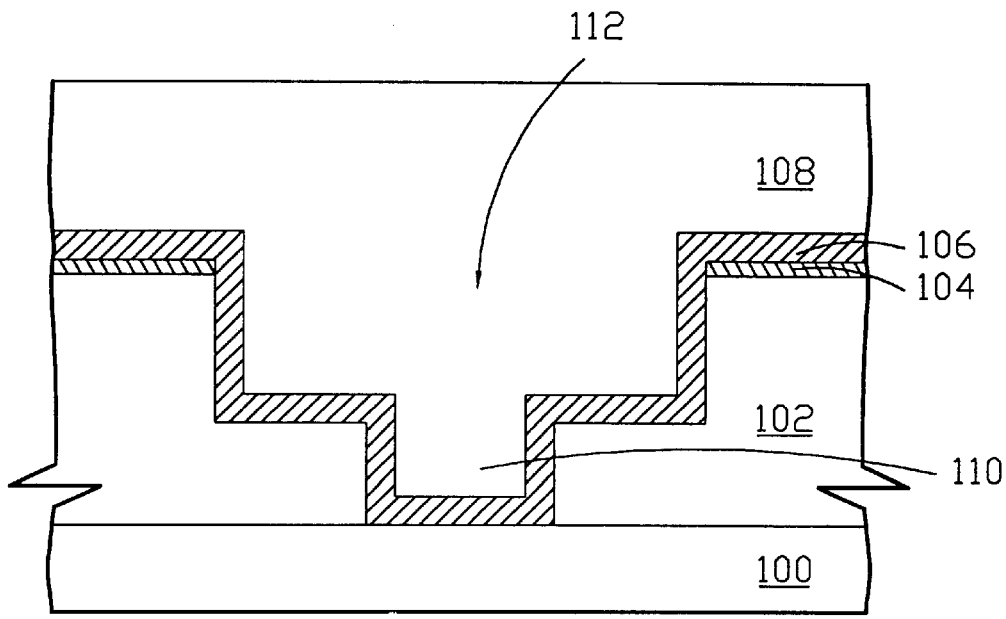
FIG. 1A depicts a schematic cross sectional view of a conventional copper/low k dielectric dual damascene structure.
Figure 1B:
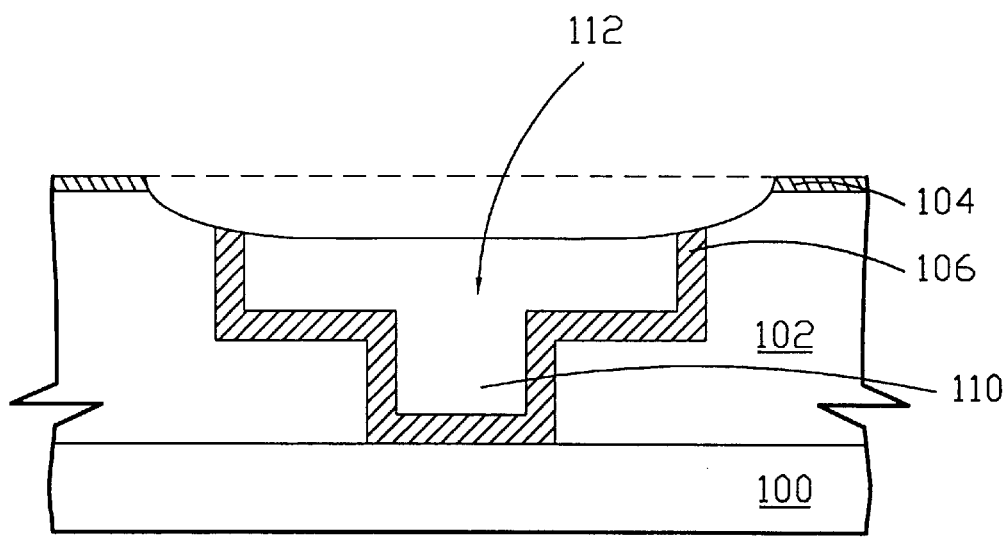
FIG. 1B depicts a schematic cross sectional view of the conventional copper/low k dielectric dual damascene structure after a Cu-CMP process and barrier CMP process, in which a dishing phenomenon of the exposed copper surface occurs.

In FIG. 1B, the substrate 100 is a semiconductor substrate having a substructure comprising devices formed in the substrate 100 and a metal layer formed thereon (not shown in the figure). The low k dielectric layer 102 is carbon-rich, containing at least 90% carbon element, and can be formed of spin-on polymer, such as aromatic hydrocarbons, SILK and FLARE. The low k dielectric layer 102 is shown with a trench 112 and a via hole 110 pattern. The barrier layer 106 is typically a Ta or TaN layer act as a liner layer for the trench 112 and the via hole 110 for preventing copper diffusion to the low k dielectric layer 102. A protection layer formed of silicon nitride/or silicon carbide on the low k dielectric layer 102 is served as the stopping layer 104 for the barrier layer's chemical mechanical polishing process. CMP Cu metal is shown with a dished structure below the dotted line of the top surface of the copper layer 108.

The barrier layer 106 of Ta/or TaN is a blanket layer conformally covering surfaces both inside and out the trench 112 and via hole 110 area. The physical vapor deposition (PVD) technique is a preferred method for the considerations of low film stress, good coverage and good adhesion.

The copper layer 108 fills into the trench 112 and via hole 110, and can be deposited using PVD, CVD, or electroplating. Typically, the copper deposition thickness can range from 1 um to several microns.

In the usual method of dual damascene, the low k dielectric layer 108 is patterned twice by the conventional photolithography and etching method. One forms the via hole 110 for interconnect and then the second forms the trench 112 for the conductive line, such as a copper line, in the low k dielectric layer 102.

Figure 2A:
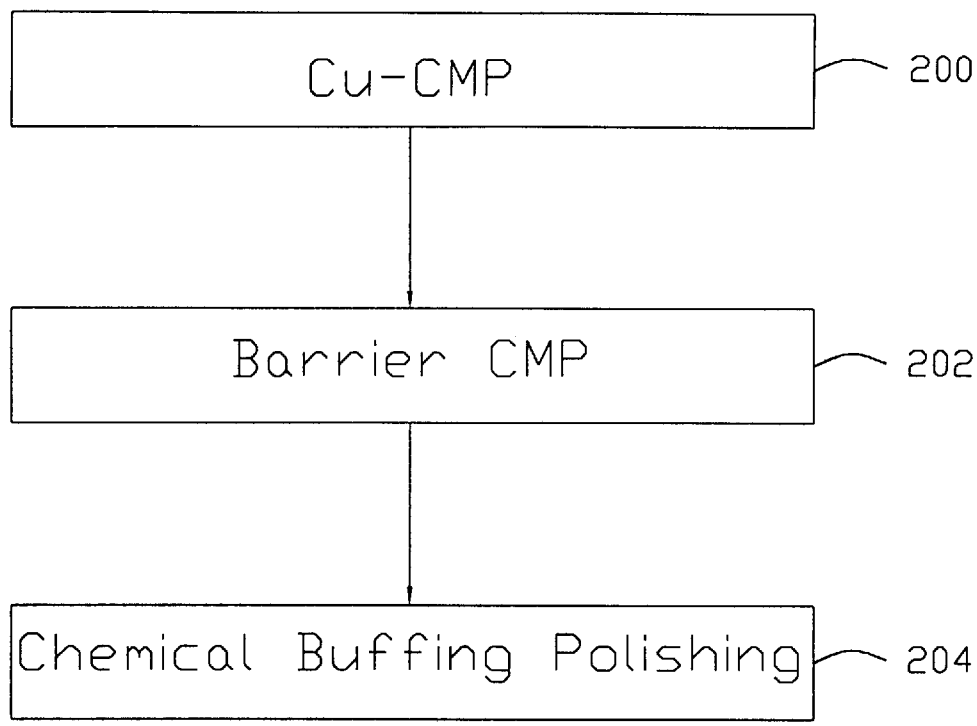
FIG. 2A depicts a flow diagram of the processes of a method according to one embodiment of the present invention.

Referring to FIG. 2A, after the copper layer 108 is deposited over the barrier layer 106, a copper chemical mechanical polishing process 200 is performed to planarize the copper layer 108 until the barrier layer 106. Then, a barrier chemical mechanical polishing process 202 is followed to remove the barrier layer 106 until the stopping layer 104. As shown in FIG. 1B, during these two CMP processes, the low k dielectric layer 102 is easily exposed and then polished due to the dishing phenomenon of the copper layer 108, as described above. And then, there are many carbon-rich particles produced and adhered on the exposed copper surface, which results in a defect in the dual damascene process. Therefore, a chemical buffing polishing process 204 using an acidic aqueous solution under a downward force of about 0.5 to 3 psi is applied to remove the carbon-rich particles adhered on the exposed copper surface through a chemical reaction. The acidic aqueous solution can be a kind of carboxylic acid aqueous solution, such as an acidic aqueous solution containing citric acid or oxalic acid. Alternately, the acidic aqueous solution can contain ammomium carboxylate salt. At final, a post CMP cleaning process is performed to remove dirt left on the exposed copper surface.

Figure 2B:
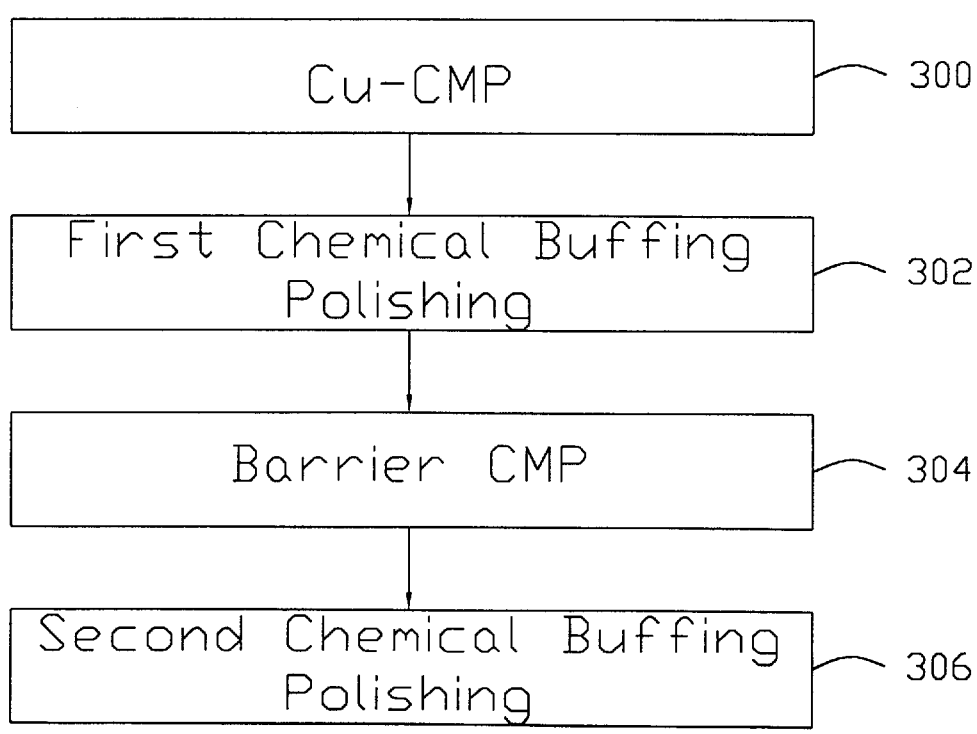
FIG. 2B depicts a flow diagram of the processes of a method according to one another embodiment of the present invention.

The low k dielectric layer 102 may have been exposed during a Cu-CMP process. Therefore, in one another embodiment of the present invention, referring to FIG. 2B, after a Cu-CMP process 300, a first chemical buffing process 302 using an acidic aqueous solution under a downward force of about 0.5 to 3 psi, is applied to remove carbon-rich particles adhered on the exposed copper surface through a chemical reaction. Subsequently, a barrier CMP process 304 is performed to remove the barrier layer 106 until the stopping layer 104, and then a second chemical buffing process using an acidic aqueous solution under a downward force of about 0.5 to 3 psi is followed to remove carbon-rich particles adhered on the exposed copper surface. The acidic aqueous solution can be a kind of aqueous solution containing a carboxylic acid, such as citric acid or oxalic acid. Alternately, the acidic aqueous solution can contain ammonium carboxylate salt. Finally, a post CMP cleaning process is employed to remove dirt left on the exposed copper surface.

The preferred embodiments are only used to illustrate the present invention, not intended to limit the scope thereof. Many modifications of the preferred embodiments can be made without departing from the spirit of the present invention.

What is claimed is:

1. A method for removing carbon-rich particles adhered on a copper surface, said method comprising:

providing a semiconductor substrate having a substructure comprising devices formed in said substrate and a metal layer formed thereon;

forming a low k dielectric layer over said substrate;

forming a stopping layer on said low k dielectric layer;

patterning said stopping layer and said low k dielectric layer to form a plurality of via holes for interconnects;

patterning said stopping layer and said low k dielectric layer to form a plurality of trenches for conductive lines;

forming a conformal blanket layer above the patterned layer of said stopping layer and said low k dielectric layer as a barrier layer;

forming a copper layer over said barrier layer to fill said via hole and said trench;

performing a copper chemical mechanical polishing process to planarize said copper layer until said barrier layer;

performing a barrier chemical mechanical polishing process to remove said barrier layer until said stopping layer;

performing a chemical buffing polishing process using an acidic aqueous solution to remove said carbon-rich particles adhered on the exposed copper surface of said copper layer filled in said trench and said via hole; and performing a post chemical mechanical polishing cleaning process.

2. The method of claim 1, wherein said low k dielectric layer is formed of spin-on polymer low k materials.

3. The method of claim 2, wherein said low k dielectric layer is formed of a spin-on polymer low k material selected from a group consisting of aromatic hydrocarbons, SILK and FLARE.

4. The method of claim 1, wherein said stopping layer is formed of silicon nitride ($Si_3N_4$).

5. The method of claim 1, wherein said stopping layer is formed of silicon carbide.

6. The method of claim 1, wherein said barrier layer is formed of Ta.

7. The method of claim 1, wherein said barrier layer is formed of TaN.

8. The method of claim 1, wherein said copper layer is formed by a chemical vapor deposition method.

9. The method of claim 1, wherein said copper layer is formed by a physical vapor deposition method.

10. The method of claim 1, wherein said copper layer is formed by an electroplating method.

11. The method of claim 1, wherein said chemical buffing polishing process is performed using an acidic aqueous solution containing a carboxylic acid.

12. The method of claim 11, wherein said carboxylic acid is citric acid.

13. The method of claim 11, wherein said carboxylic acid is oxalic acid.

14. The method of claim 1, wherein said chemical buffing polishing process is performed using an acidic aqueous solution containing ammonium carboxylate salt.

15. The method of claim 1, wherein said chemical buffing polishing process is performed under a downward force of about 0.5 to 3 psi.

16. A method for removing carbon-rich particles adhered on a copper surface, said method comprising:

providing a semiconductor substrate having a substructure comprising devices formed in said substrate and a metal layer formed thereon;

forming a low k dielectric layer over said substrate;

forming a stopping layer on said low k dielectric layer;

patterning said stopping layer and said low k dielectric layer to form a plurality of via holes for interconnects;

patterning said stopping layer and said low k dielectric layer to form a plurality of trenches for conductive lines;

forming a conformal blanket layer above the patterned layer of said stopping layer and said low k dielectric layer as a barrier layer;

forming a copper layer over said barrier layer to fill said via hole and said trench;

performing a copper chemical mechanical polishing process to planarize said copper layer until said barrier layer;

performing a first chemical buffing polishing process using an acidic aqueous solution to remove said carbon-rich particles adhered on the exposed copper surface of said copper layer filled in said trench and said via hole;

performing a barrier chemical mechanical polishing process to remove said barrier layer until said stopping layer;

performing a second chemical buffing polishing process using an acidic aqueous solution to remove said carbon-rich particles adhered on the exposed copper surface of said copper layer filled in said trench and said via hole; and performing a post chemical mechanical polishing cleaning process.

17. The method of claim 16, wherein said low k dielectric layer is formed of spin-on polymer low k materials.

18. The method of claim 17, wherein said low k dielectric layer is formed of a spin-on polymer low k material selected from a group consisting of aromatic hydrocarbons, SILK and FLARE.

19. The method of claim 16, wherein said stopping layer is formed of silicon nitride ($Si_3N_4$).

20. The method of claim 16, wherein said stopping layer is formed of silicon carbide.

21. The method of claim 16, wherein said barrier layer is formed of Ta.

22. The method of claim 16, wherein said barrier layer is formed of TaN.

23. The method of claim 16, wherein said copper layer is formed by a chemical vapor deposition method.

24. The method of claim 16, wherein said copper layer is formed by a physical vapor deposition method.

25. The method of claim 16, wherein said copper layer is formed by an electroplating method.

26. The method of claim 16, wherein said first chemical buffing polishing process is performed using an acidic aqueous solution containing a carboxylic acid.

27. The method of claim 26, wherein said carboxylic acid is citric acid.

28. The method of claim 26, wherein said carboxylic acid is oxalic acid.

29. The method of claim 16, wherein said first chemical buffing polishing process is performed using an acidic aqueous solution containing ammonium carboxylate salt.

30. The method of claim 16, wherein said second chemical buffing polishing process is performed using an acidic aqueous solution containing a carboxylic acid.

31. The method of claim 30, wherein said carboxylic acid is citric acid.

32. The method of claim 30, wherein said carboxylic acid is oxalic acid.

33. The method of claim 16, wherein said second chemical buffing polishing process is performed using an acidic aqueous solution containing ammonium carboxylate salt.

34. The method of claim 16, wherein said first chemical buffing polishing process is performed under a downward force of about 0.5 to 3 psi.

35. The method of claim 16, wherein said second chemical buffing polishing process is performed under a downward force of about 0.5 to 3 psi.

* * * * *